(12) United States Patent
Haidner et al.

(10) Patent No.: US 7,911,624 B2
(45) Date of Patent: Mar. 22, 2011

(54) DEVICE AND METHOD FOR THE INTERFEROMETRIC MEASUREMENT OF PHASE MASKS

(75) Inventors: Helmut Haidner, Aalen (DE); Ulrich Wegmann, Koenigsbronn (DE)

(73) Assignee: Carl Zeiss SMS GmbH, Jena (DE)

( * ) Notice: Subject to any disclaimer, the term of this patent is extended or adjusted under 35 U.S.C. 154(b) by 184 days.

(21) Appl. No.: 12/065,275

(22) PCT Filed: Aug. 31, 2006

(86) PCT No.: PCT/EP2006/008502
§ 371 (c)(1),
(2), (4) Date: Feb. 28, 2008

(87) PCT Pub. No.: WO2007/025746
PCT Pub. Date: Mar. 8, 2007

(65) Prior Publication Data
US 2008/0231862 A1      Sep. 25, 2008

(30) Foreign Application Priority Data
Aug. 31, 2005   (DE) .................. 10 2005 041 203

(51) Int. Cl.
*G01B 11/02*   (2006.01)
(52) U.S. Cl. .................................................. 356/515
(58) Field of Classification Search .......... 356/452, 356/499, 508, 509, 510, 515, 521, 500; 250/237 G
See application file for complete search history.

(56) References Cited

U.S. PATENT DOCUMENTS

| | | | |
|---|---|---|---|
| 5,426,503 A | 6/1995 | Kusunose | |
| 5,576,829 A | 11/1996 | Shiraishi et al. | |
| 6,018,392 A | 1/2000 | Tzu et al. | |
| 6,078,393 A | 6/2000 | Oohashi et al. | |
| 6,122,056 A | 9/2000 | Hibbs et al. | |

(Continued)

FOREIGN PATENT DOCUMENTS

DE   101 09 929 A1   11/2001

(Continued)

OTHER PUBLICATIONS

G. Fütterer, et al., "Lateral Shearing Interferometer for Phase Shift Mask Measurement at 193 nm," *Proc. SPIE*, vol. 4691, pp. 541-551 (2002).

(Continued)

*Primary Examiner* — Gregory J Toatley
*Assistant Examiner* — Scott M Richey
(74) *Attorney, Agent, or Firm* — Patterson Thuente Christensen Pedersen, P.A.

(57) ABSTRACT

A device and method for the interferometric measurement of phase masks, particularly from lithography. Radiation passing through a coherence mask is brought to interference by a diffraction grating. A phase mask is arranged in or near the pupil plane of the first imaging optics which can be positioned exactly in the x-y direction by which interferograms are generated which are phase-shifted in the x-y direction by translational displacement of the coherence mask or of the diffraction grating. The interferograms are imaged onto the spatially resolving detector by second imaging optic and the phase and transmission functions of the phase mask are determined by an evaluation unit. The invention can, of course, generally be applied to planar phase objects, such as biological structures, for example, points of establishment with respect to an interference microscope.

35 Claims, 4 Drawing Sheets

U.S. PATENT DOCUMENTS

| | | | |
|---|---|---|---|
| 6,239,878 B1* | 5/2001 | Goldberg | 356/520 |
| 6,239,909 B1* | 5/2001 | Hayashi et al. | 359/569 |
| 6,307,635 B1 | 10/2001 | Goldberg | |
| 6,559,953 B1 | 5/2003 | Davids | |
| 6,573,997 B1* | 6/2003 | Goldberg et al. | 356/521 |
| 6,727,512 B2 | 4/2004 | Stokowski et al. | |
| 6,788,388 B2* | 9/2004 | Smith | 355/67 |
| 7,088,458 B1* | 8/2006 | Wegmann | 356/515 |
| 7,136,143 B2 | 11/2006 | Smith | |
| 7,268,890 B2* | 9/2007 | Emer | 356/515 |
| 7,333,216 B2 | 2/2008 | Wegmann et al. | |
| 7,400,388 B2* | 7/2008 | Emer et al. | 356/124 |
| 7,403,291 B2* | 7/2008 | Yamamoto et al. | 356/515 |
| 7,408,631 B2* | 8/2008 | Arnz et al. | 356/124 |
| 7,408,652 B2* | 8/2008 | Wegmann et al. | 356/515 |
| 7,417,745 B2* | 8/2008 | Haidner et al. | 356/515 |
| 7,443,515 B2* | 10/2008 | Kato | 356/515 |
| 7,445,938 B2* | 11/2008 | Angeley | 436/164 |
| 7,724,376 B2* | 5/2010 | Tezuka | 356/515 |
| 7,796,274 B2* | 9/2010 | Mengel et al. | 356/515 |
| 2004/0174533 A1* | 9/2004 | Nakauchi | 356/515 |
| 2005/0007602 A1 | 1/2005 | Haidner et al. | |
| 2005/0046863 A1 | 3/2005 | Millerd et al. | |
| 2007/0182969 A1* | 8/2007 | Mengel et al. | 356/495 |
| 2008/0180688 A1* | 7/2008 | Mengel et al. | 356/515 |
| 2008/0252876 A1* | 10/2008 | Mengel et al. | 356/51 |
| 2009/0051928 A1* | 2/2009 | Primot et al. | 356/521 |
| 2009/0116036 A1* | 5/2009 | Wegmann | 356/521 |
| 2009/0201512 A1* | 8/2009 | Primot et al. | 356/521 |
| 2009/0262364 A1* | 10/2009 | Primot et al. | 356/521 |
| 2010/0002243 A1* | 1/2010 | Aizawa et al. | 356/521 |

FOREIGN PATENT DOCUMENTS

| | | |
|---|---|---|
| DE | 102 60 985 A1 | 5/2004 |
| DE | 102 58 142 A1 | 6/2004 |
| DE | 103 16 123 A1 | 10/2004 |
| EP | 1 231 517 A1 | 8/2002 |
| JP | 10062258 A | 3/1998 |
| WO | WO 03/058681 A2 | 7/2003 |
| WO | WO 2004/055472 A2 | 7/2004 |

OTHER PUBLICATIONS

H. Kusunose, et al., "Phase Measurement System with Transmitted UV Light for Phase-Shifting Mask Inspection," *SPIE*, vol. 2254, pp. 294-301 (1994).

J. Schwider, et al., "Diffractive Lateral Shearing Interferometer for Phase Shift Mask Measurement Using an Excimer Laser Source," *SPIE*, vol. 5776, pp. 270-277 (2005).

R. Petit, et al., "Topics in Current Physics/Electromagnetic Theory of Gratings," Publisher: Springer Verlag, Berlin, (1980).

H. Haider, et al., "Optimization and reconstruction of high-frequency surface relief gratings," *OPTIK*, vol. 90, No. 1, pp. 32-36 (1992).

\* cited by examiner

DEVICE AND METHOD FOR THE INTERFEROMETRIC MEASUREMENT OF PHASE MASKS

FIELD OF THE INVENTION

The present invention relates to a device and a corresponding method for the interferometric measurement of phase masks, in particular in lithography. In lithography, phase masks are used to transfer structures, which are below the Abbe resolution limit, to wafers. Measurement of the phase masks is required in order to prevent a faulty transfer of the structures.

BACKGROUND OF THE INVENTION

According to the known prior art, phase masks are used in lithography to increase the lateral resolution. In contrast to conventional masks comprising transparent and non-transparent regions, PSMs ("phase shift masks") have a phase shift of usually 180° between transparent regions. Moreover, there are also masks which comprise both conventional mask regions and regions including phase shift structures.

According to the prior art, solutions based on interferometric arrangements are known for the measurement of optical imaging systems for lithographic applications.

In this connection, DE 102 58 142 A1 describes a device for optical measurement of an imaging system by wavefront detection using shearing interferometry. This involves detection of a superimposed structure by means of an object structure to be arranged preceding the imaging system on the object side, an image structure to be arranged following the imaging system on the image side and a detector and evaluating unit arranged following said image structure and evaluating said superimposed structure by means of the object structure and image structure. The image structure and/or the object structure include(s) a periodic multi-frequency pattern, which comprises, in at least one direction, at least two different periodicity lengths and/or at least one two-dimensional main pattern with periodically arranged structure fields and at least one sub-pattern formed in structure fields of the main pattern. For example, the device may be used for high-precision, spatially resolved measurement of projection lenses in microlithography systems for structuring semi-conductor elements.

Further, in DE 102 60 985 A1, a device is described for interferometric wavefront measurement of an optical imaging system, wherein the measurement of an optical imaging system is effected by wavefront detection using shearing interferometry. The solution provides for the use of an illuminating part to be arranged preceding the imaging system on the object side, of a diffraction grating to be arranged following the imaging system and preceding the image plane of said imaging system, of a filter mask to be arranged in the image plane of the imaging system, and of a detector unit arranged following the filter mask, wherein the illuminating part includes a coherence mask having a multiple-opening structure designed to reduce undesired orders of diffraction. Moreover, the filter mask is arranged to be movable in the image plane of the imaging system. For example, the device may be used with respect to possible imaging errors for spatially resolved measurement of high-aperture projection lenses of microlithography systems.

A further solution claiming a device and a method for detection of wavefronts of electromagnetic radiation, in particular visible and ultraviolet light as well as soft X-rays, is described in DE 101 09 929 A1. The two-dimensional structure of the wavefront source allows to adapt the spatial coherence of the radiation such that the wavefronts transformed by the optical system can be measured with high precision. The proposed device is suitable for both coherent and incoherent radiation ranging from infrared light to X-rays. A large spectral range is available already when using conventional CCD camera technology for the spatially resolving detector. However, at extremely short wavelengths, a photo-emission electron microscope (PEEM), for example, can also be used as spatially resolving detector. The spatially resolving detector can also comprise a sensor designed with CMOS technology, having low power consumption and enabling integration of a D/A converter on the detector. A sensor using CID (charge injection device) technology is also possible.

U.S. Pat. No. 6,573,997 B1 describes a hybrid shearing and point diffraction interferometer, which combines the strengths of two existing interferometry methods, increases the precision of measurement and improves the dynamics of both systems. The stop used therein and arranged near the image plane of an optical system contains patterns for both interferometry methods. The described solution is provided to check projection optics of photolithographic systems. In particular, one embodiment of the solution also allows to check a single optical element. For this purpose, this optical element is irradiated by an electromagnetic energy source and sequentially examined, by shifting the hybrid mask into the optical beam path, interferometrically, by means of shearing and phase shift point diffraction interferometry. Using the described hybrid interferometer system, different imaging errors can be determined and characterized so as to prevent the projection optics from projecting washed out, unfocused images on the wafer. The analysis of the interferogram and of the resulting wavefront allows to deduce the presence of deviations.

Further, solutions are known in the prior art which allow to examine structures by the use of interferometric arrangements.

Methods based on a "lateral shearing interferometer" (LSI) are respectively described by Fütterer in [1] and by Schwider in [3]. In this measurement arrangement, which comprises a pinhole as the illumination source, the diffraction grating is positioned outside the focus in the parallel beam path. A stop which filters out certain orders of diffraction is arranged in the focus of the first imaging system.

A shearing interference microscope is described by Kusunose et al. in [2]. However, this interferometer is very bulky due to the multiplicity of optical elements used and represents a not very compact measurement arrangement.

REFERENCES

[1] Fütterer G. et al; Lateral Shearing Interferometer for Phase Shift Mask Measurement at 193 nm; (2002) SPIE vol. 4691; 541-551

[2] Kusuonese H. et al; Phase Measurement System with Transmitted Light UV Light for Phase-Shifting Mask Inspection; (1994); SPIE vol. 2254; 294-301

[3] Schwider J. et al; Diffractive Lateral Interferometer for Phase Shift Mask Measurement Using an Excimer Laser Source; (2005), SPIE vol. 5776; 270-277

[4] Petit R.; Electromagnetic Theory of Gratings; Springer Verlag; Berlin; 1980;

[5] Haidner H., Kipfer P., Streibl N.; Optimization and Reconstruction of High Frequency Surface Relief Gratings; Optik 90 (1992) 92

SUMMARY OF THE INVENTION

It is the object of the present invention to develop a quick, quantitative measurement method allowing to characterize phase masks with minimal structural dimensions in a region of approximately 200 nm with respect to transmission and phase in connection with mask inspection.

In the inventive solution for interferometric measurement of phase masks, an incoherently illuminated coherence mask is imaged on a diffraction grating via first imaging optics, there being present, in or near the pupil plane of the first imaging optics, a phase mask which can be exactly positioned in the x-y plane, for example in order to measure phase masks with different shearing distances and shearing directions. Interferograms which are phase-shifted in the x-y direction, are generated by this phase mask by translatorial shifting of the coherence mask or of the pinhole or of the diffraction grating, respectively, and are imaged on a spatially resolving detector via second imaging optics. Based on these interferograms, the evaluating unit determines the phase and transmission functions of the phase mask, with imaging of the interferograms onto the spatially resolving detector being effected with magnification.

Although the proposed device and the corresponding method are provided, in particular, for interferometric measurement of photolithographic phase masks, the solution can be generally applied, of course, to planar phase objects, such as biological structures, for example, in which case connecting points to an interference microscope will result.

BRIEF DESCRIPTION OF THE DRAWINGS

The invention will be described in more detail below with reference to exemplary embodiments. In the drawings.

DETAILED DESCRIPTION

In the following, a differentiated LSI measurement arrangement shall refer to an LSI measurement arrangement wherein a coherence mask is used instead of the usual pinhole and the diffraction grating is arranged in the focus of the imaging system. The coherence mask in the reticle has the effect that only some orders of diffraction, here particularly the $-1^{th}$, the $0^{th}$ and the $+1^{th}$ order of diffraction, are made to interfere.

The inventive device for interferometric measurement of phase masks consists of an interferometric measurement arrangement, comprising a source of radiation, a diffraction grating, two imaging optics, a spatially resolving detector and an evaluating unit. The radiation passing through a coherence mask or through the pinhole is made to interfere by a diffraction grating, there being arranged, in or near the pupil plane of the first imaging optics, a phase mask which can be exactly positioned in the x-y direction. Interferograms, which are phase-shifted in the x-y direction, are generated by this phase mask by translatorial displacement of the coherence mask or of the pinhole or of the diffraction grating, respectively, and are imaged on the spatially resolving detector via second imaging optics. Based on the phase-shifted interferograms, the evaluating unit determines the phase and transmission functions of the phase mask, with imaging of the interferograms onto the spatially resolving detector being effected with magnification. This makes it possible to measure a small partial area of the phase mask, for example 10 µm×10 µm in size, and to image, with magnification, the generated, phase-shifted interferograms on the spatially resolving detector.

In advantageous embodiments, the source of radiation can emit radiation of different wavelengths for which the imaging optics are suitably corrected. Moreover, it is advantageous if the incoherent radiation can emit radiation which is differently polarized by additional polarization filters. For this purpose, the polarization filters are arranged near a plane conjugated to the pupil plane of the first imaging optics. The coherence mask arranged on a reticle, as well as the diffraction grating arranged on a substrate as an amplitude grating, are preferably movable and exchangeable. The phase mask arranged in the pupil plane of the first imaging optics can be inclined in a defined manner with respect to the optical axis of the interferometric measurement arrangement. The magnified imaging of the phase-shifted interferograms is realized by the first, the second or both imaging optics, with the second imaging optics preferably being exchangeable so as to realize different magnification levels.

Using a source of radiation which preferably emits radiation of different wavelengths, the spectrally dependent measurement data, i. e. the spectrally dependent amplitude and phase distributions, allow obtaining additional information which permits conclusions as to the type of local disturbances, such as disturbances of the material properties due to contamination.

A further advantageous embodiment provides that the phase mask can be inclined in a defined manner with respect to the optical axis of the interferometric measurement arrangement. This allows, in particular, the edges of the phase steps to be imaged and measured with improved lateral resolution. Moreover, this allows reflection artifacts to be avoided.

By application of these two advantageous embodiments, the reliability and precision of measurement can be substantially improved, because a greater number of different measurement data is available.

In order to avoid falsification of the results of measurement by imaging errors of the interferometric measurement arrangement, it is convenient to calibrate the measurement arrangement. Whereas calibration of the phase function is effected by a planar plate of known thickness, which plate is arranged in the pupil plane of the first imaging optics, calibration of the transmission function is effected by a planar plate of known transmission, which is also arranged in the pupil plane of the first imaging optics. This allows both the aberrations of the imaging system and the inhomogeneities of the illumination, caused by the illumination and by the imaging system, to be calibrated out.

In a first alternative embodiment, the interferometric measurement arrangement can be provided as a "differentiated lateral shearing interferometer" (LSI), in which the diffraction grating is arranged in the focal plane of the first imaging optics.

Figure 1:
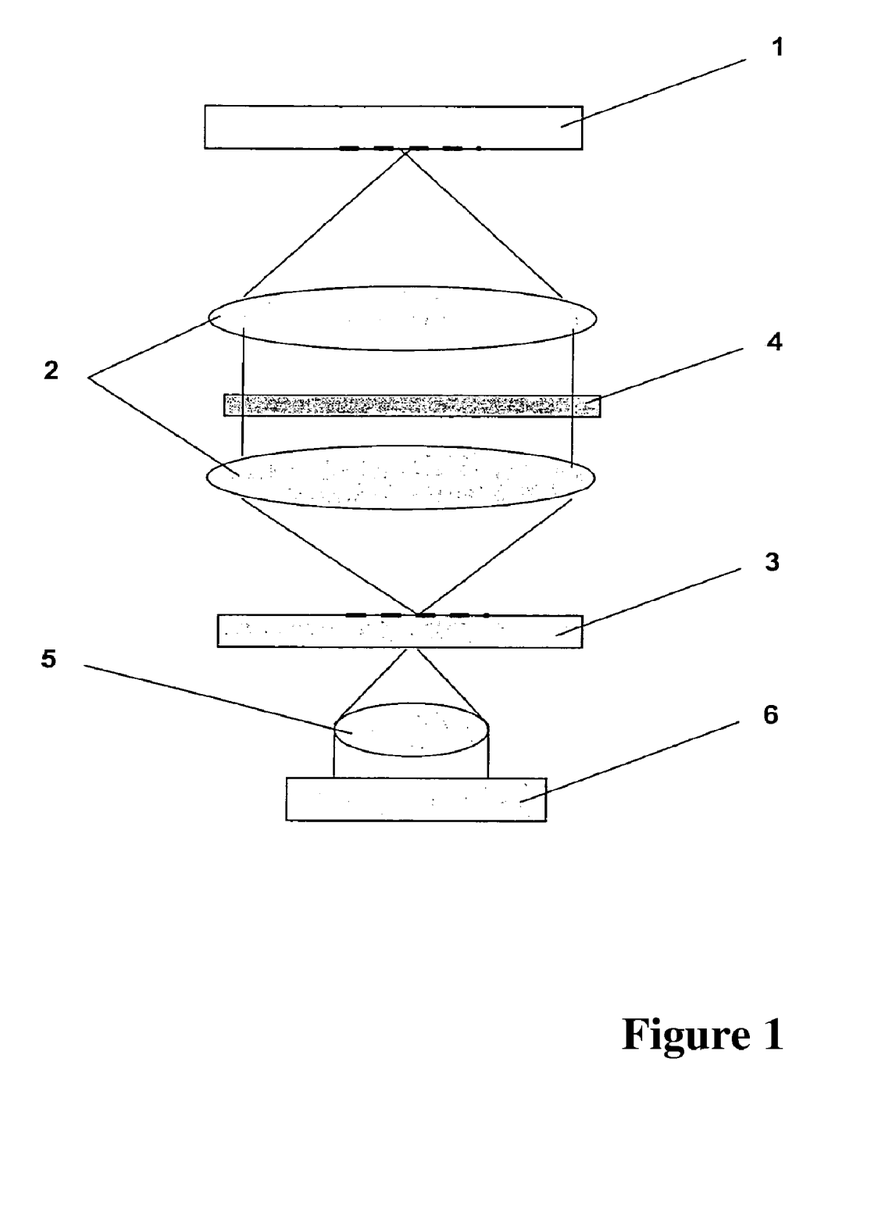
FIG. 1 shows a differentiated LSI measurement arrangement.

In the differentiated LSI (dLSI) measurement arrangement shown in FIG. 1, an incoherently illuminated coherence mask 1 is imaged via first imaging optics 2 onto the diffraction grating 3. In or near the pupil plane of the first imaging optics 2, there is arranged the phase mask 4 to be measured, which can be exactly positioned in the x-y direction. In this case, the phase mask 4 can be moved to the desired x-y position with µm accuracy, so that the desired, predetermined regions of the phase mask 4 can be examined. Phase-shifted interferograms of the phase mask 4 are generated by translatorial shifting of the coherence mask 1 or of the diffraction grating 3 in the x-y direction and are imaged on the spatially resolving detector 6 via the second imaging optics 5. Based on the phase-shifted interferograms, the evaluating unit (not shown) determines the phase and transmission functions of the phase mask 4, with imaging of the interferograms on the spatially resolving detector 6 being effected with magnification. In this case, the individual elements of the LSI measurement arrangement may have the already mentioned advantageous embodiments.

An exemplary embodiment of a differentiated LSI (dLSI) measurement arrangement can be described by the following parameters:

| | |
|---|---|
| Mask period | 5.79 mm |
| Period of the diffraction grating: | 5.79 mm |
| NA of the first imaging optics: | 1, 2, 3:0.9 |
| Magnification of the second imaging optics | 1:360 |
| Observed detail of the phase mask: | 10 µm × 10 µm |
| Detector: | 800 pixels at a pixel size of 9 µm |
| Shearing in the unmagnified image: | 100 nm |
| Shearing in the magnified image: | 36 µm |

In a further embodiment, in order to increase the structural resolution, the imaging optics 2 and 5 can also be designed as immersion optics so that numerical apertures of greater than 1 are possible.

For the interferometric measurement of phase masks, interferograms are generated which form due to superposition of the $-1^{th}$, $0^{th}$ and $+1^{th}$ order of diffraction, of which two or even all three can be superimposed upon one another. In this case, the period of the coherence mask has the same period as the diffraction grating, if the aspect ratio is taken into consideration as well. On the other hand, if the period of the coherence mask is selected to be twice the period of the diffraction grating (again, referring to the aspect ratio), the coherence function will have a zero point for a shearing distance 1 (distance between the $0^{th}$ and the $1^{st}$ or the $0^{th}$ and the $-1^{th}$ order of diffraction of the grating) and a finite value for a shearing distance 2 (distance between the $-1^{th}$ and the $+1^{th}$ order of diffraction of the grating), so that the interferogram will show a contrast when the $-1^{th}$ and $+1^{th}$ orders of diffraction are superimposed upon one another and the superposition with the $0^{th}$ order of diffraction is then prevented.

In the case of three superimposed orders of diffraction, there will be an averaging effect due to which the measured gradient of two derivations (interferogram from the $-1^{th}$ und $0^{th}$ orders of diffraction and interferogram from the $0^{th}$ and $+1^{th}$ order of diffraction) will be averaged. In contrast to 2-beam coherence masks, 3-beam coherence masks do not lead to regions without information on the phase and on the transmission in phase masks.

On the other hand, the evaluation of interferograms with 3-beam interference turns out to be more difficult. Particularly at the transitions from transparent to non-transparent regions a distinction has to be made between regions with 2-beam interference and those with 3-beam interference. Since the averaging effect has to be numerically corrected, it can be advantageous, therefore, to work with 2-beam coherence masks in some regions and with 3-beam coherence masks in other regions.

In a second alternative embodiment, the interferometric measurement arrangement can be provided as a "point diffraction interferometer" (PDI). In contrast to the differentiated LSI arrangement, a pinhole is used here instead of the coherence mask. Moreover, the diffraction grating is arranged outside the focal plane of the first imaging optics and an additional pinhole is arranged inside it.

Figure 2:
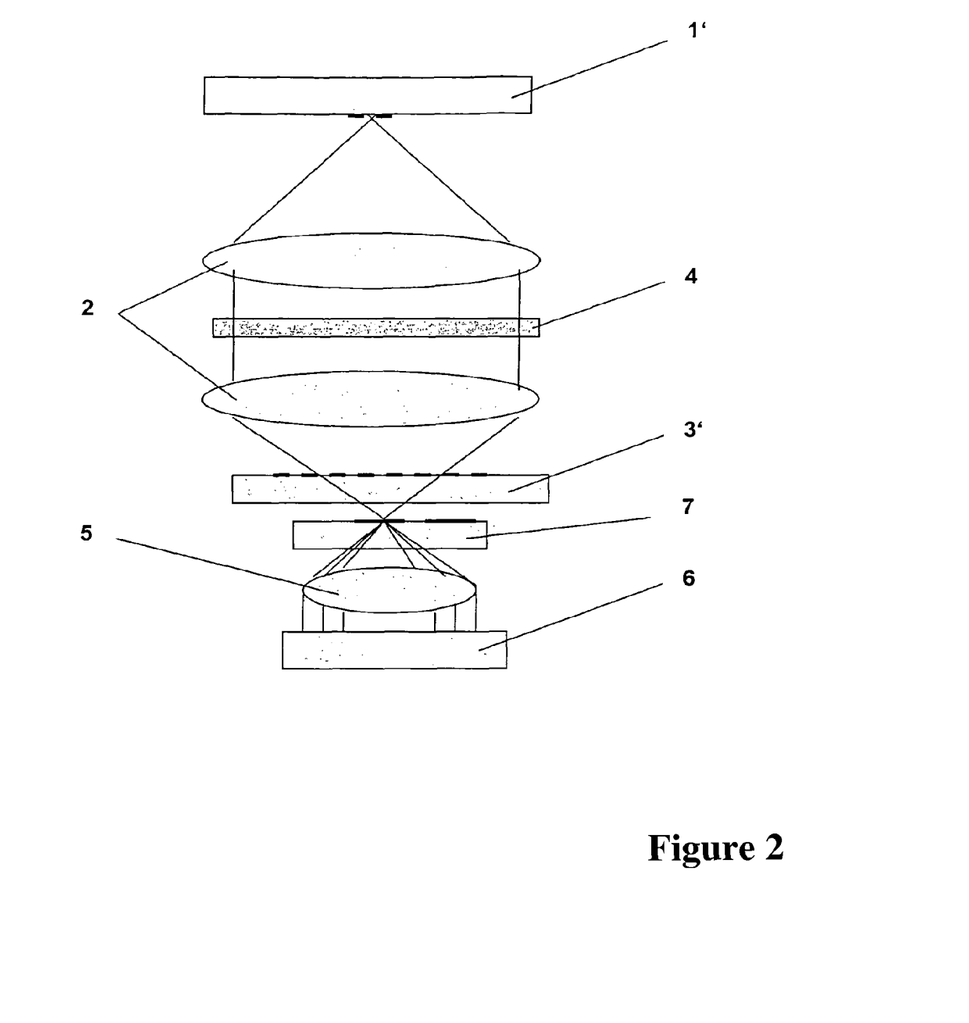
FIG. 2 shows a PDI measurement arrangement.

In the PDI measurement arrangement shown in FIG. 2, the mask 1' having a pinhole is imaged on the stop structure 7 by first imaging optics 2. In this case, the pinhole generates a coherent spherical wave by diffraction, with the diameter of the pinhole typically being smaller than the wavelength. In this variant, the diffraction grating 3' is arranged outside the focal plane of the first imaging optics 2 and an additional stop structure 7 is arranged in it. The additional stop structure 7 is also provided as a pinhole. In the pupil plane of the first imaging optics 2, there is arranged the phase mask 4 to be measured, which can be exactly positioned in the x-y direction here, too. In this case, the phase mask 4 can be moved to the desired x-y position with µm accuracy, so that the predetermined regions of the phase mask 4 can be examined. Phase-shifted interferograms of the phase mask 4 are generated by translatorial shifting of the mask 1' or of the diffraction grating 3' in the x-y direction and are imaged on the spatially resolving detector 6 via the second imaging optics 5. Based on the phase-shifted interferograms, the evaluating unit (not shown) determines the phase and transmission functions of the phase mask 4, with the imaging of the interferograms on the spatially resolving detector 6 being effected with magnification. In this case, the individual elements of the PDI measurement arrangement may have the already mentioned advantageous embodiments.

In a third alternative embodiment, the coherence mask, the diffraction grating and the stop structure are exchangeable so that the interferometric measurement arrangement can be selectively used as an LSI or PDI.

In the inventive method for interferometric measurement of phase masks, the radiation passing through a coherence mask or through the pinhole is made to interfere by a diffraction grating, there being arranged, in or near the pupil plane of the first imaging optics, a phase mask which can be exactly positioned in the x-y direction. Phase-shifted interferograms are generated by translatorial displacement of the pinhole or of the diffraction grating in the x-y direction and are imaged on a spatially resolving detector by second imaging optics. Based on these phase-shifted interferograms, the evaluating unit determines the phase and transmission function of the phase mask, with imaging of the interferograms onto the spatially resolving detector being effected with magnification.

In advantageous embodiments, the source of radiation can emit radiation of different wavelengths for which the imaging optics are suitably corrected. Moreover, it is advantageous if the incoherent radiation can emit radiation which is differently polarized by additional polarization filters. For this purpose, the polarization filters are arranged near a plane which is conjugated to the pupil plane of the first imaging optics. The pinhole arranged on a reticle, as well as the diffraction grating arranged on a substrate as an amplitude grating, are preferably movable and exchangeable. The phase mask arranged in the pupil plane of the first imaging optics can be inclined in a defined manner with respect to the optical axis of the interferometric measurement arrangement. Magnified imaging of the phase-shifted interferograms can be realized by the first, the second or both imaging optics, with the second imaging optics preferably being exchangeable so as to realize different magnification levels. If the magnified imaging is effected by the first imaging optics, said optics can be embodied as a two-stage imaging system, with the necessary magnification having to take place between the two stages.

In advantageous embodiments, the represented PDI measurement arrangement can be embodied as a hybrid PDI/LSI measurement arrangement.

Figure 3:
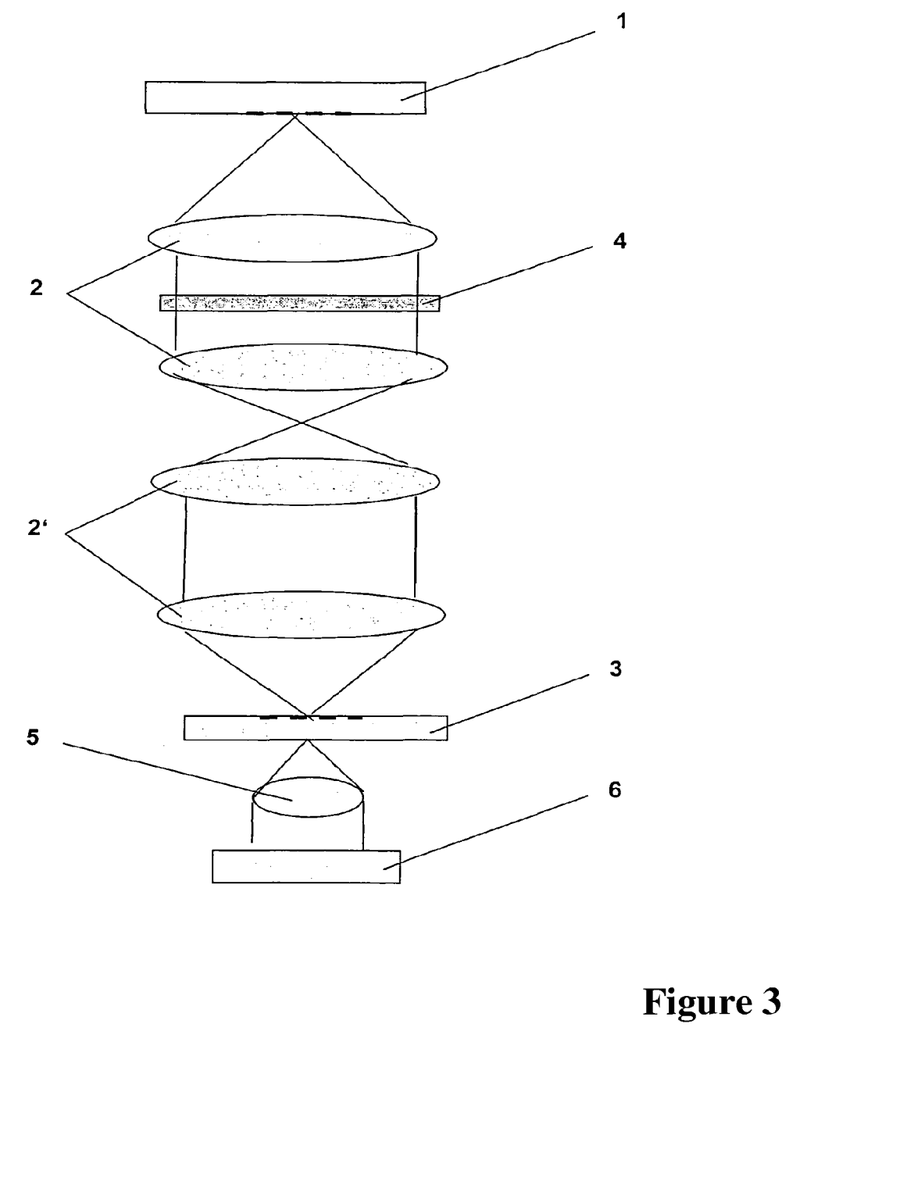
FIG. 3 shows a differentiated LSI measurement arrangement comprising first two-stage imaging optics.

In this connection, FIG. 3 shows a differentiated LSI measurement arrangement comprising two-stage first imaging optics wherein the enlarged image is generated between the partial optics 2 and 2'.

In order to avoid falsification of the results of measurement by imaging errors of the interferometric measurement arrangement, it is convenient to calibrate the measurement arrangement. Whereas calibration of the phase function is effected by a planar plate of known thickness, which plate is arranged in the pupil plane of the first imaging optics, calibration of the transmission function is effected by a planar plate of known transmission, which is also arranged in the pupil plane of the first imaging optics. This allows both the aberrations of the imaging system and the inhomogeneities of the illumination, caused by the illumination and by the imaging system, to be calibrated out.

In this case, interferometric measurement can be effected both by a differentiated "lateral shearing interferometer" (dLSI) and by a "point diffraction interferometer" (PDI). Whereas a dLSI measurement arrangement has the diffraction grating arranged in the focal plane of the first imaging optics, a PDI measurement arrangement has the diffraction grating arranged outside the focal plane of the first imaging optics and an additional stop structure arranged inside it. Whereas the PDI measurement arrangement uses a pinhole for illumination, the dLSI measurement arrangement, in contrast to the LSI measurement arrangement, has a coherence mask instead of a pinhole.

An extremely advantageous alternative embodiment is obtained if the coherence mask, the pinhole, the diffraction grating and the stop structure are made exchangeable, so that the interferometric measurement arrangement can be selectively used as a dLSI or a PDI.

Independently of the interferometric measurement arrangement used, the phase function and the transmission function of the phase mask are determined by the evaluating unit on the basis of the phase-shifted interferograms. When determining the transmission function, the reflected and/or absorbed radiation components attributable to the interferometer optics have to be taken into consideration. Said consideration has to be effected in a spatially resolved manner, because the transmission of the system depends on the site of passage through the interferometer optics.

The solution according to the invention allows determination in absolute teiins of both the phase function and the transmission function of a phase mask having small structural dimensions. However, as already described, this requires calibration of the interferometric measurement arrangement.

Using the described interferometric measurement arrangements, it has turned out that particular demands have to be placed on the measurement of small structural dimensions.

Thus, for example, interferograms of a Ronchi grating serving as a phase mask with a phase depth of $\pi$ have been evaluated, varying inter alia the numeric aperture (NA) of the imaging optics and the period of the Ronchi grating.

It has turned out that the measured phase functions and, thus, also the measured transmission functions of phase masks with small structures are a function of the following parameters:

the NA of the imaging optics;
the polarization condition of the light source used;
the wavelength of the light source used;
the pixel size of the spatially resolving detector;
the shearing distance and direction, as well as
the surface profile and material composition of the phase mask.

This also makes it difficult to interpret the measured phase function, because the measured phase function in the plane of the detector does not translate 1:1 to the phase function, i.e. the surface profile of the phase mask.

Figure 4A:
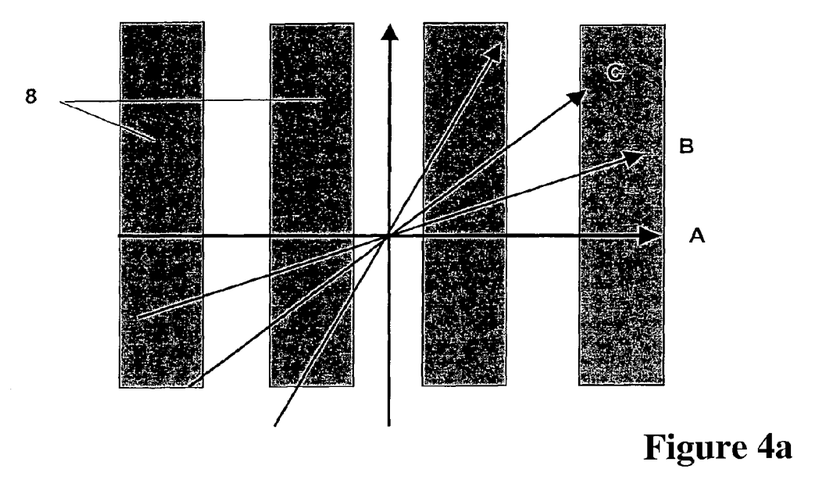
FIG. 4a shows the structure of a phase mask with different shearing directions.
Figure 4B:
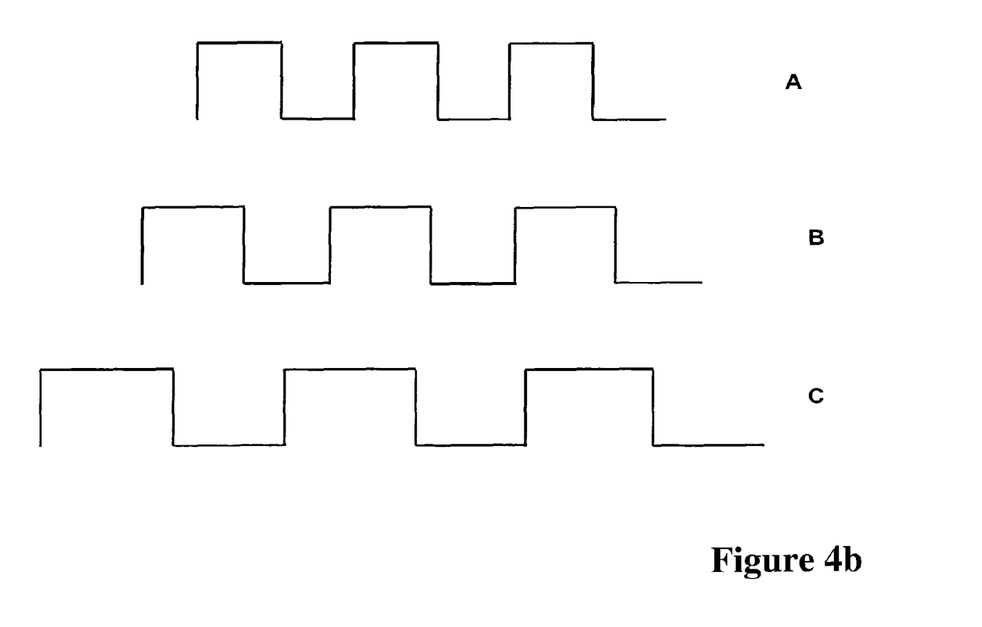
FIG. 4b shows the measured sections of the phase function for the different shearing directions.

In order to more clearly illustrate the dependence of the phase and transmission functions of a phase mask on the shearing direction, FIG. 4a shows the structures 8 of a phase mask with different shearing directions A, B and C for interferometric measurement. The measured sections of the phase function for these different shearing directions A, B and C are represented in FIG. 4b. It can be seen that an increase in resolution is possible due to different shearing directions. It should be noted that the spatial resolution can be increased by selecting a suitable shearing direction A, B and C, which is important, in particular, for small structures. By measuring the phase mask in different shearing directions and/or with different shearing distances, as well as different angles of inclination, the reliability and precision of measurement can be considerably improved here as well, because a greater number of different measurement data is available for evaluation.

The variation of shearing distances and directions is effected in different ways, depending on the interferometric measurement arrangement used.

Whereas the interferometric measurement arrangement in the form of a "lateral shearing interferometer" (LSI) or a "point diffraction interferometer" (PDI) effects measurements with different shearing distances and shearing directions by combining diffraction gratings which differ with respect to their grating periods and grating directions with stop structures at different distances, the interferometric measurement arrangement in the form of a differentiated "lateral shearing interferometer" (dLSI) combines coherence masks and diffraction gratings which differ in their grating periods and grating directions.

Moreover, in interferometric measurement of phase masks having small structures, the occurrence of different optical effects influencing the results of measurement can be expected. Thus, for example, in the case of small structural dimensions, not all spatial frequencies are transmitted by the imaging optics anymore. At the transitions of the represented phase regions, a so-called "overshoot" of the ripples (Gibbs phenomenon) appears.

If the structural dimensions of the phase mask are already within the range of the wavelength, the effect of the phase mask can no longer be described just by a transmission function whose real part describes the transmission and whose imaginary part describes the phase delay. The effect of such structural dimensions is described by vectorial diffraction theories [4]. Since the determined results of measurement vary, depending on the polarization direction used for the illumination radiation, the use of polarization filters is recommendable.

The use of polarization filters for a defined setting of the polarization direction of the source of radiation, as well as the use of multi-frequency diffraction gratings in combination with different coherence masks, for adapting the shearing distance to the structural size of the examined site on the phase mask can ensure high precision of measurement.

Determining the phase function and/or transmission function is effected using a measurement model which takes the aforementioned parameters of the interferometric measurement arrangement into consideration. With the help of the measurement model, the surface profile of the phase mask can be computed on the basis of the measured phase function and transmission function.

In this case, the measurement model may be based on the inverse diffraction theory which is, in turn, based on a priori information concerning the surface profile of the phase mask and on information concerning the measurement parameters.

In the measurement model, an inverse calculation back to the real phase mask before imaging is effected, for example, on the basis of the phase and transmission functions determined by the method of measurement. Such inverse calculation is possible only for simple structures. In reality, the simpler forward calculation [4] may be employed in combination with iterative optimizing methods [5], so as to obtain the phase and transmission functions of the phase mask. In order to enable quicker calculation, "look-up tables" may be used, in which certain surface parameters, such as e.g. height and width of the structure, have been calculated. The measurement model takes into consideration the above-mentioned measurement conditions, such as transmitted NA, wavelength, polarization condition, pixel size of the detector, shearing distance, shearing direction, etc. If the structural dimensions of the phase mask are within the region of the wavelength, the rigorous diffraction theory is to be used for the forward calculation. Said calculation also takes into account the polarization conditions of the light. The effect of the phase mask can no longer be described simply by a transmission function whose real part describes the transmission and whose imaginary part describes the phase delay due to the phase mask.

The inventive device and the method for interferometric measurement of phase masks provide a solution by which both the phase and the transmission functions of a phase mask having small structural dimensions can be determined in absolute terms.

The proposed solution is characterized, in particular, by the fact that it works with the same laser radiation sources as, for example, scanner/stepper systems.

Due to the possibility of variable shearing distances and shearing directions, of an inclined arrangement of the phase mask in the beam path, as well as an incoherent radiation source emitting different wavelengths, the reliability and precision of measurement can be improved considerably.

The proposed interferometric measurement arrangements exhibit compactness and robustness with respect to environmental influences.

The invention claimed is:

1. A device for interferometric measurement of phase masks, comprising an interferometric measurement arrangement, comprising:
a source of radiation;
a diffraction grating;
two imaging optics including a first imaging optics and a second imaging optics;
a spatially resolving detector; and
an evaluating unit;
wherein radiation passing through either a coherence mask or through a pinhole is made to interfere by a diffraction grating, and further wherein a phase mask is arranged, in or near the pupil plane of the first imaging optics and wherein the phase mask can be precisely positioned in an x-y direction and by which at least two interferograms that are phase-shifted in the x-y direction relative to each other are generated by translational displacement of one of the coherence mask and the pinhole or the diffraction grating between a first position and a second position, one interferogram being generated in the first position and another interferogram being generated in the second position, and wherein the at least two interferograms are imaged on the spatially resolving detector via the second imaging optics and from which the evaluation unit determines the phase and transmission functions of the phase mask, and further wherein imaging of the interferograms onto the spatially resolving detector is effected with magnification.

2. The device as claimed in claim 1, wherein the source of radiation emits incoherent radiation and can emit radiation at different wavelengths, for which the imaging optics are suitably corrected.

3. The device as claimed in claim 1, wherein the source of radiation emits incoherent radiation that is differently polarized by additional polarization filters, said polarization filters being arranged near a plane which is conjugate to the pupil plane of the first imaging optics.

4. The device as claimed in claim 1, wherein the coherence mask or the pinhole is arranged on a reticle and is movable and exchangeable.

5. The device as claimed in claim 1, wherein radiation passes through the coherence mask and further wherein two or three beams selected from a group consisting of the $-^{th}$, $0^{th}$ and $+1^{th}$ order of diffraction interfere at the coherence mask.

6. The device as claimed in claim 1, wherein the diffraction grating comprises an amplitude grating on a substrate that is movable and exchangeable.

7. The device as claimed in claim 1, wherein the phase mask arranged at the pupil plane of the first imaging optics can be inclined in a defined manner with respect to an optical axis of the interferometric measurement arrangement.

8. The device as claimed in claim 1, wherein magnified imaging of the interferograms is realized by the first imaging optics, the second imaging optics or both the first and second imaging optics.

9. The device as claimed in claim 1, wherein the second imaging optics are exchangeable so as to realize different magnification levels.

10. The device as claimed in claim 1, further comprising a planar plate of known thickness for calibration of the phase function at the pupil plane of the first imaging optics, the planar plate being adapted to be inserted proximate the pupil plane of the first imaging optics for calibration of the phase function and to be removed for measurement.

11. The device as claimed in claim 1, further comprising a planar plate of known transmission for calibration of the transmission function at the pupil plane of the first imaging optics, the planar plate being adapted to be inserted for calibration of the transmission function and to be removed for measurement.

12. The device as claimed in claim 1, wherein the interferometric measurement arrangement comprises a differentiated lateral shearing interferometer, with the diffraction grating being arranged approximately in the focal plane of the first imaging optics.

13. The device as claimed in claim 1, wherein the interferometric measurement arrangement comprises a lateral shearing interferometer (LSI) comprising a pinhole and an additional stop structure and wherein the diffraction grating arranged outside the focal plane of the first imaging optics and the additional stop structure is arranged approximately in the focal plane of the first imaging optics.

14. The device as claimed in claim 1, wherein the interferometric measurement arrangement comprises a point diffraction interferometer (PDI) comprising a pinhole and an additional stop structure and the diffraction grating is arranged outside the focal plane of the first imaging optics and the additional stop structure is arranged approximately in the focal plane of the first imaging optics plane.

15. The device as claimed in claim 1, wherein the coherence mask or the pinhole, the diffraction grating and a stop structure are exchangeable, so that the interferometric measurement arrangement may include, selectively or combined, a differentiated lateral shearing interferometer, a lateral shearing interferometer and point diffraction interferometer.

16. A method for interferometric measurement of phase masks, comprising:
    making radiation passing through a coherence mask or a pinhole to interfere by a diffraction grating;
    arranging, in or near a pupil plane of first imaging optics, a phase mask, which can be precisely positioned in the x-y direction and by which interferograms phase-shifted in the x-y direction can be generated by translational displacement of the coherence mask, the pinhole or of the diffraction grating between a first position and a second position;
    generating a first interferogram when the coherence mask, the pinhole or the diffraction grating is in the first position;
    generating a second interferogram when the coherence mask, the pinhole or the diffraction grating is in the second position;
    imaging the interferograms on a spatially resolving detector via second imaging optics;
    determining the phase and transmission functions of the phase mask from the interferograms with an evaluating unit; and
    effecting imaging of the interferograms onto the spatially resolving detector with magnification.

17. The method as claimed in claim 16, further comprising selecting the source of radiation to comprise an incoherent source of radiation that emits radiation at different wavelengths for which the imaging optics are suitably corrected.

18. The method as claimed in claim 16, further comprising differently polarizing the radiation by additional polarization filters, that are arranged near a plane which is conjugate to the pupil plane of the first imaging optics.

19. The method as claimed in claim 16, further comprising arranging the coherence mask or the pinhole on a reticle and making the coherence mask or the pinhole, whichever is present, movable and exchangeable.

20. The method as claimed in claim 16, providing the coherence mask such that two or three rays selected from a group consisting of the $-1_{th}$, $0^{th}$ and $+1^{th}$ order of diffraction interfere.

21. The method as claimed in claim 16, further comprising arranging the diffraction grating on a substrate and forming the diffraction grating as an amplitude grating and making the diffraction grating movable and exchangeable.

22. The method as claimed in claim 16, further comprising arranging the phase mask at a pupil plane of the first imaging optics such that the phase mask can be inclined in a defined manner with respect to an optical axis of the interferometric measurement arrangement.

23. The method as claimed in claim 16, further comprising imaging the interferograms magnified by the first imaging optics, the second imaging optics or both the first and second imaging optics.

24. The method as claimed in claim 16, further comprising structuring the second imaging optics to be exchangeable so as to realize different magnification levels.

25. The method as claimed in claim 16, further comprising locating a planar plate of known thickness for calibration of a phase function approximately in the pupil plane of the first imaging optics.

26. The method as claimed in claim 16, further comprising locating a planar plate of known transmission for calibration of a transmission function approximately in the pupil plane of the first imaging optics.

27. The method as claimed in claim 16, further comprising structuring the interferometric measurement arrangement in the form of a differentiated lateral shearing interferometer (dLSI) wherein the diffraction grating is arranged approximately in the focal plane of the first imaging optics.

28. The method as claimed in claims 16, further comprising structuring the interferometric measurement arrangement in the form of a lateral shearing interferometer (LSI) wherein a pinhole and the diffraction grating are arranged outside the focal plane of the first imaging optics and an additional stop structure is arranged approximately in the focal plane of the first imaging optics.

29. The method as claimed in claim 16, further comprising structuring the interferometric measurement arrangement in the form of a point diffraction interferometer (PDI) wherein a pinhole and the diffraction grating are arranged outside the focal plane of the first imaging optics and an additional stop structure is arranged approximately in the focal plane of the first imaging optics.

30. The method as claimed in claim 16, further comprising making the coherence mask, the pinhole, the diffraction grating and the stop structure exchangeable, so that the interferometric measurement arrangement may include, selectively or combined, a differentiated "lateral shearing interferometer", lateral shearing interferometer and/or a point diffraction interferometer.

31. The method as claimed in claims 16, evaluating the phase function and the transmission function of the phase mask from the phase-shifted interferograms.

32. The method as claimed in claims 16, further comprising determining the phase function and/or the transmission function using a measurement model in which parameters of the interferometric measurement arrangement are taken into consideration.

33. The method as claimed in claim 16, further comprising effecting measurements using different shearing distances and shearing directions, and structuring the interferometric measurement arrangement in the form of a differentiated lateral shearing interferometer (dLSI) combining coherence masks and diffraction gratings which differ with respect to their grating periods and grating directions.

34. The method as claimed in claim 16, further comprising effecting measurements using different shearing distances and shearing directions and structuring the interferometric measurement arrangement in the form of a lateral shearing interferometer (LSI) combining diffraction gratings and stop structures, wherein the diffraction gratings differ with respect to their grating periods and grating directions, at different distances.

35. The method as claimed in claim 16, further comprising effecting measurements using different shearing distances and shearing directions and structuring the interferometric measurement arrangement in the form of a point diffraction interferometer (PDI) combining diffraction gratings and stop structures in the form of pinholes, wherein the gratings differ with respect to their grating periods and grating directions, at different distances.

* * * * *

UNITED STATES PATENT AND TRADEMARK OFFICE
CERTIFICATE OF CORRECTION

| | | |
|---|---|---|
| PATENT NO. | : 7,911,624 B2 | |
| APPLICATION NO. | : 12/065275 | |
| DATED | : March 22, 2011 | |
| INVENTOR(S) | : Helmut Haidner and Ulrich Wegmann | |

It is certified that error appears in the above-identified patent and that said Letters Patent is hereby corrected as shown below:

On the title page item (87), PCT Publication Number. Missing "A1" after the listed numerals.

Col. 7, line 48, "in absolute teiins of both" should be "in absolute terms of both".

Col. 10, line 23, claim 5, "consisting of the $-^{th}$" should be "consisting of the $-1^{th}$".

Col. 11, line 49, claim 20, "consisting of the $-1_{th}$" should be "consisting of the $-1^{th}$".

Col. 2, line 52, "Kusounese" should be "Kusunose".

Col. 5, line 48, "und" should be "and".

Col. 12, line 14, claim 28, "claimed in claims 16" should be "claimed in claim 16".

Col. 12, line 32, claim 30, "lateral shearing interferometer" should have the quotation marks deleted.

Signed and Sealed this
Eighteenth Day of October, 2011

David J. Kappos
*Director of the United States Patent and Trademark Office*